US012588443B2

(12) United States Patent
Lu et al.

(10) Patent No.: US 12,588,443 B2
(45) Date of Patent: Mar. 24, 2026

(54) METHODS FOR FORMING LOW RESISTIVITY CONTACTS

(71) Applicant: Applied Materials, Inc., Santa Clara, CA (US)

(72) Inventors: Jiang Lu, Milpitas, CA (US); Liqi Wu, San Jose, CA (US); Wei Dou, Sunnyvale, CA (US); Weifeng Ye, San Jose, CA (US); Shih Chung Chen, Santa Clara, CA (US); Rongjun Wang, Dublin, CA (US); Xianmin Tang, San Jose, CA (US); Yiyang Wan, Sunnyvale, CA (US); Shumao Zhang, San Jose, CA (US); Jianqiu Guo, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 405 days.

(21) Appl. No.: 18/139,590

(22) Filed: Apr. 26, 2023

(65) Prior Publication Data

US 2024/0105444 A1 Mar. 28, 2024

Related U.S. Application Data

(60) Provisional application No. 63/410,422, filed on Sep. 27, 2022.

(51) Int. Cl.
*H01L 21/02* (2006.01)
*C23C 16/04* (2006.01)

(52) U.S. Cl.
CPC ........ *H01L 21/0217* (2013.01); *C23C 16/045* (2013.01); *H01L 21/02274* (2013.01); *H01L 21/0228* (2013.01)

(58) Field of Classification Search
CPC ......... H01L 21/76843; H01L 21/76876; H01L 21/7685; H01L 21/76861; H01L 21/76864;
(Continued)

(56) References Cited

U.S. PATENT DOCUMENTS 6,139,702 A * 10/2000 Yang ................... C23C 14/3457
257/E21.252
9,240,347 B2 1/2016 Chandrashekar et al.
(Continued)

OTHER PUBLICATIONS

PCT International Search Report and Written Opinion for PCT/US2023/033273 dated Jan. 18, 2024.

*Primary Examiner* — Scott B Geyer
(74) *Attorney, Agent, or Firm* — Moser Taboada

(57) ABSTRACT

Methods for reducing contact resistance include performing a selective titanium silicide (TiSi) deposition process on a middle of the line (MOL) contact structure that includes a cavity in a substrate of dielectric material. The contact structure also includes a silicon-based connection portion at a bottom of the cavity. The selective TiSi deposition process is selective to silicon-based material over dielectric material. The methods also include performing a selective deposition process of a metal material on the MOL contact structure. The selective deposition process is selective to TiSi material over dielectric material and forms a silicide capping layer on the silicon-based connection portion. The methods further include performing a seed layer deposition process of the metal material on the contact structure.

20 Claims, 3 Drawing Sheets

(58) Field of Classification Search
CPC ......... H01L 21/76865; H01L 21/76879; H01L 21/28052; H01L 21/28061; H01L 21/28097; H01L 21/28518; H10D 84/013–0133; H10D 84/0137; H10D 84/017; H10D 84/0174; H10D 64/663; H10D 64/664; H10D 64/668; H10D 30/0212–0213; H10D 30/794
See application file for complete search history.

(56) References Cited

U.S. PATENT DOCUMENTS

| | | | |
|---|---|---|---|
| 9,548,228 B2 | 1/2017 | Chandrashekar et al. | |
| 9,613,818 B2 | 4/2017 | Ba et al. | |
| 10,374,040 B1 | 8/2019 | Chanemougame et al. | |
| 10,395,944 B2 | 8/2019 | Fung et al. | |
| 2003/0143841 A1* | 7/2003 | Yang ................. | H01L 21/28556 |
| | | | 438/653 |
| 2018/0247865 A1 | 8/2018 | Adusumilli et al. | |
| 2020/0020716 A1 | 1/2020 | Kim et al. | |
| 2020/0058758 A1 | 2/2020 | Adusumilli et al. | |
| 2020/0105593 A1* | 4/2020 | Wu .................... | H10D 84/0158 |
| 2020/0203490 A1* | 6/2020 | Thareja .................. | H10D 64/01 |
| 2021/0082829 A1* | 3/2021 | Yang ................. | H01L 21/76867 |
| 2021/0104397 A1* | 4/2021 | Jung ................. | H01L 21/28562 |
| 2021/0320034 A1 | 10/2021 | Lei et al. | |
| 2024/0290609 A1* | 8/2024 | Ishizaka ............ | H01L 21/28556 |

* cited by examiner

330

302

334

332

314D

314C

321

342B

314E

314B

303B

342

340

314F

314A

321

342A

303A

316B

316A

306B

306A

338

338

307

305D     305C          305B     305A

301

304

300

METHODS FOR FORMING LOW RESISTIVITY CONTACTS

CROSS-REFERENCE TO RELATED APPLICATIONS

This application claims benefit of U.S. provisional patent application Ser. No. 63/410,422, filed Sep. 27, 2022, which is herein incorporated by reference.

FIELD

Embodiments of the present principles generally relate to semiconductor chambers used in semiconductor processes.

BACKGROUND

Middle of the line (MOL) contacts allow connections between front end of the line (FEOL) semiconductor structures and back end of the line (BEOL) interconnects. When MOL contacts have high resistance, the contacts produce poor connections between the FEOL structures and the BEOL packaging interconnects, reducing the performance of the packaged semiconductor structures. In traditional MOL contact formation, titanium silicide (TiSi) is formed on a silicon or silicon germanium connection as a capping layer and then nitrided to form titanium silicon nitride (TiSiN) to prevent oxidation of the TiSi. The final silicide capping layer is a bilayer of TiSi and TiSiN. The inventors have observed, however, that the TiSiN layer has high resistivity (approximately 300 µohms-cm for a thickness of approximately 6 nm).

Thus, the inventors have provided improved methods to reduce MOL contact resistance by forming contacts without using a high resistance TiSiN or TiN layer.

SUMMARY

Methods for reducing middle of the line contact resistance are provided herein.

In some embodiments, a method for reducing contact resistance may comprise performing a selective titanium silicide (TiSi) deposition process on a middle-of-the-line (MOL) contact structure including a cavity in a substrate of dielectric material with a silicon-based connection portion at a bottom of the cavity where the selective TiSi deposition process is selective to silicon-based material over dielectric material and a TiSi layer of approximately 3 nm to approximately 6 nm is formed on the silicon-based connection portion, performing a selective deposition process of a metal material on the MOL contact structure where the selective deposition process is selective to TiSi material over dielectric material and forms a silicide capping layer on the silicon-based connection portion, and performing a seed layer deposition process of the metal material on the contact structure, wherein the metal material deposited on the contact structure is approximately 2 nm to approximately 3 nm in thickness.

In some embodiments, the method may further include dielectric material that is silicon dioxide or silicon nitride where the silicon-based connection portion is silicon or silicon germanium and where the silicon-based material is silicon or silicon germanium, where the selective TiSi deposition process is a chemical vapor deposition (CVD) process with a selectivity of silicon-based material to dielectric material of at least 30:1, where the selective deposition process is a fluorine free metal deposition process of the metal material, where the fluorine free metal deposition process is a halide based atomic layer deposition (ALD) process or chemical vapor deposition (CVD) process using a metal chloride gas with hydrogen gas or a process using metalorganic precursors, where the seed layer deposition process is a plasma vapor deposition (PVD) process that anneals the metal material deposited by the fluorine free metal deposition process, where the metal material is tungsten or molybdenum, performing a preclean process on the MOL contact structure prior to performing the selective TiSi deposition process, performing a selective etch process to remove portions of the metal material deposited by the seed layer deposition process on sidewalls of the cavity of the MOL contact structure while maintaining the metal material on the bottom of the contact structure and on the silicon-based connection portion and depositing a metal gapfill material in a bottom-up selective deposition process to fill the MOL contact structure, where the selective etch process is a dry etch process or a wet etch process, where the bottom-up selective deposition process is a selective chemical vapor deposition (CVD) process, depositing a metal gapfill material in the cavity of the MOL contact structure using a conformal deposition process, and/or where the method uses a mix of tungsten material and molybdenum material in the method.

In some embodiments, a method for reducing contact resistance may comprise performing a selective titanium silicide (TiSi) deposition process on a middle-of-the-line (MOL) contact structure including a cavity in a substrate of dielectric material with a silicon-based connection portion at a bottom of the cavity, wherein the selective TiSi deposition process is selective to silicon-based material over dielectric material and a TiSi layer of approximately 3 nm to approximately 6 nm is formed on the silicon-based connection portion; performing a selective deposition process of fluorine free tungsten on the MOL contact structure in-situ, wherein the selective deposition process is selective to TiSi material over dielectric material and forms a silicide capping layer on the silicon-based connection portion; performing a seed layer deposition process of tungsten on the contact structure, wherein tungsten deposited on the contact structure is approximately 2 nm to approximately 3 nm in thickness; performing a selective etch process to remove portions of tungsten deposited by the seed layer deposition process on sidewalls of the cavity of the MOL contact structure while maintaining tungsten on the bottom of the contact structure and on the silicon-based connection portion; and depositing a tungsten gapfill material in a bottom-up selective deposition process to fill the MOL contact structure.

In some embodiments, the method may further include dielectric material that is silicon oxide or silicon nitride where the silicon-based connection portion is silicon or silicon germanium and where the silicon-based material is silicon or silicon germanium, where the selective TiSi deposition process is a chemical vapor deposition (CVD) process with a selectivity of silicon-based material to dielectric material of at least 30:1, where the selective deposition process is a halide based atomic layer deposition (ALD) process or chemical vapor deposition (CVD) process using a tungsten chloride gas with hydrogen gas or a process using metalorganic precursors, where the seed layer deposition process is a plasma vapor deposition (PVD) process that anneals tungsten deposited by the selective deposition process, and/or where the bottom-up selective deposition process is a selective chemical vapor deposition (CVD) process.

In some embodiments, a non-transitory, computer readable medium having instructions stored thereon that, when executed, cause a method for decreasing contact resistance to be performed, the method comprising performing a selective titanium silicide (TiSi) deposition process on a middle-of-the-line (MOL) contact structure including a cavity in a substrate of dielectric material with a silicon or silicon germanium connection portion at a bottom of the cavity, wherein the selective TiSi deposition process is selective to silicon or silicon germanium material over dielectric material and a TiSi layer of approximately 3 nm to approximately 6 nm is formed on the silicon or silicon germanium connection portion; performing a selective deposition process of fluorine free tungsten on the MOL contact structure in-situ, wherein the selective deposition process is selective to TiSi material over dielectric material and forms a silicide capping layer on the silicon or silicon germanium connection portion; performing a seed layer deposition process of tungsten on the contact structure, wherein tungsten deposited on the contact structure is approximately 2 nm to approximately 3 nm in thickness; performing a selective etch process to remove portions of tungsten deposited by the seed layer deposition process on sidewalls of the cavity of the MOL contact structure while maintaining tungsten on the bottom of the contact structure and on the silicon or silicon germanium connection portion; and depositing a tungsten gapfill material in a bottom-up selective deposition process to fill the MOL contact structure.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
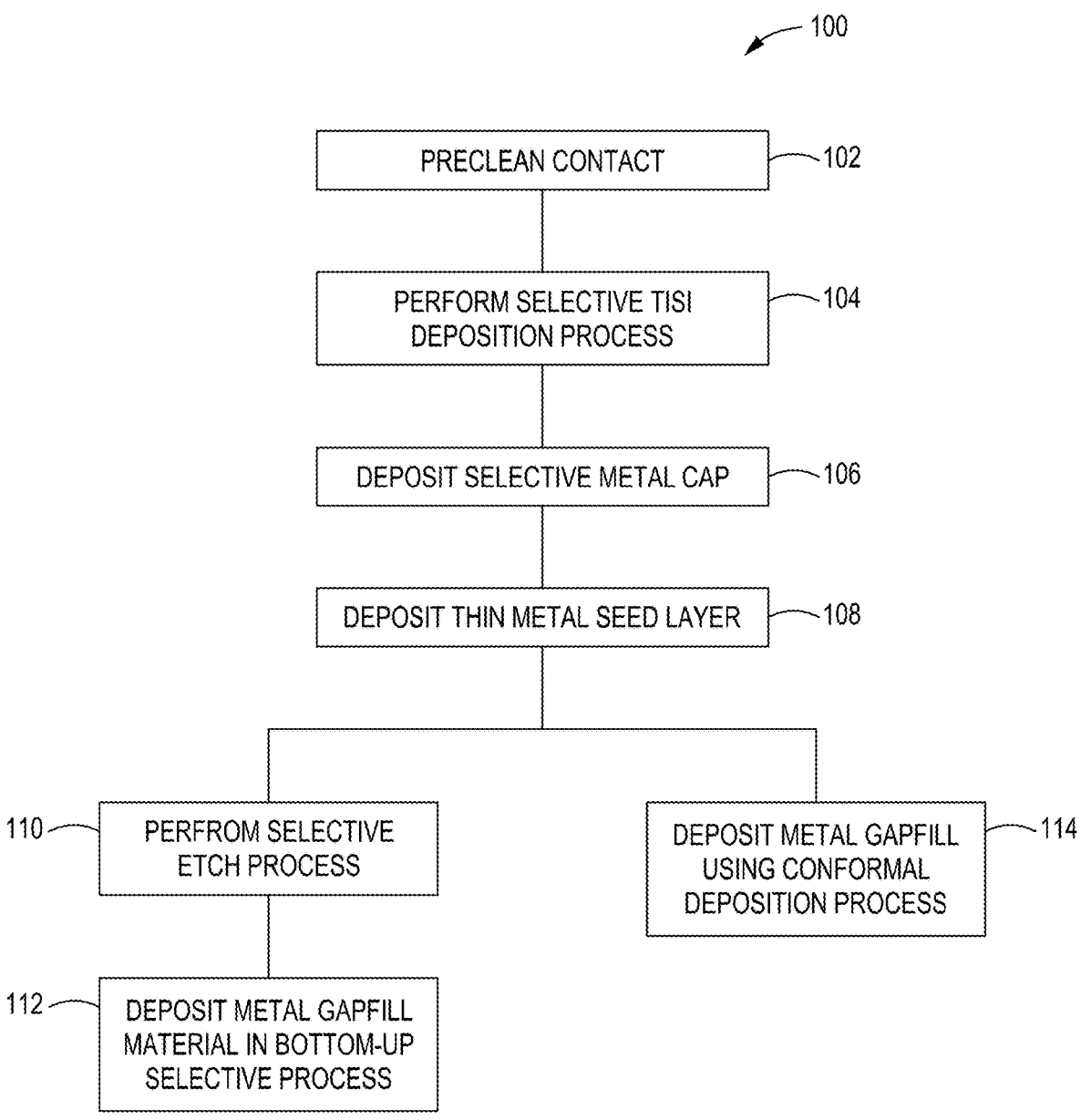
FIG. 1 is a method of reducing contact resistance in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide middle of the line (MOL) contacts with reduced resistivity. An innovative integration flow integrates multiple MOL processes on the same integrated tool, eliminating high resistivity material in the integration stack to achieve low contact resistance (Rc). Titanium silicide (TiSi) capping layers are capped with selective tungsten (W) followed by a plasma vapor deposition (PVD) tungsten seed layer to eliminate the need for high resistivity titanium silicon nitride (TiSiN) and titanium nitride (TiN) from the contact film stack, achieving low contact Rc. The MOL contact integration flow advantageously removes the need for TiSiN and TiN film layers altogether. Selective tungsten deposition is then used to enable bottom-up tungsten fill in some embodiments to further reduce Rc. The methods of the present principles also leverage a highly selective chemical vapor deposition (CVD) TiSi deposition process along with an in-situ TiSi/W integration flow that eliminates the high resistive TiSiN film layers and reduces the thickness of a high-cost fluorine free tungsten (FFW) deposition process.

In brief, the integration flow offers several key integration benefits for MOL contact structures. Highly selective CVD TiSi deposition on Si eliminates TiSiN capping layers which reduces contact Rc, FFW+PVD W metal capping that reduces both FFW and PVD W thickness requirements as an oxidation and F barrier, simple and low-cost dry process for TiSi/W pull back (etch), integrated bottom-up fill W flow which reduces overall Rc and cost, integrated conformal W fill, and W can be replaced by Mo capping layer and gapfill. In some embodiments, for example, removal of the TiSiN layer in the process reduces the resistivity of a silicide cap layer from approximately 300 $\mu$ohms-cm for a TiSiN layer thickness of approximately 6 nm to approximately less than 20 $\mu$ohms-cm with a capping layer according to the methods of the present principles.

The methods disclosed herein are effective for metal gapfill processes in general and may be used with other metal gapfill material besides tungsten such as, for example and not meant to be limiting, molybdenum and the like. For the sake of brevity, examples discussed use tungsten but are not meant to be limited to only tungsten. In the method 100 of FIG. 1, a highly selective CVD TiSi deposition and in-situ TiSi/W integration flow eliminates the high resistive TiSiN layer and reduces the high-cost fluorine free metal thickness (metal capping thickness). In the discussion of the method 100, references will be made to the views 200A-200I of FIG. 2. In block 102, a preclean process is performed to remove any contaminates and/or oxidation from surfaces of a contact structure as depicted in a view 200A of FIG. 2. The contact structure has a silicon-based portion 204 that is exposed in a cavity 210 of a substrate 202 formed of a dielectric material (e.g., silicon dioxide, silicon nitride, etc.). In some embodiments, the silicon-based portion 204 may be a silicon material or a silicon germanium (SiGe) material.

Figure 2:
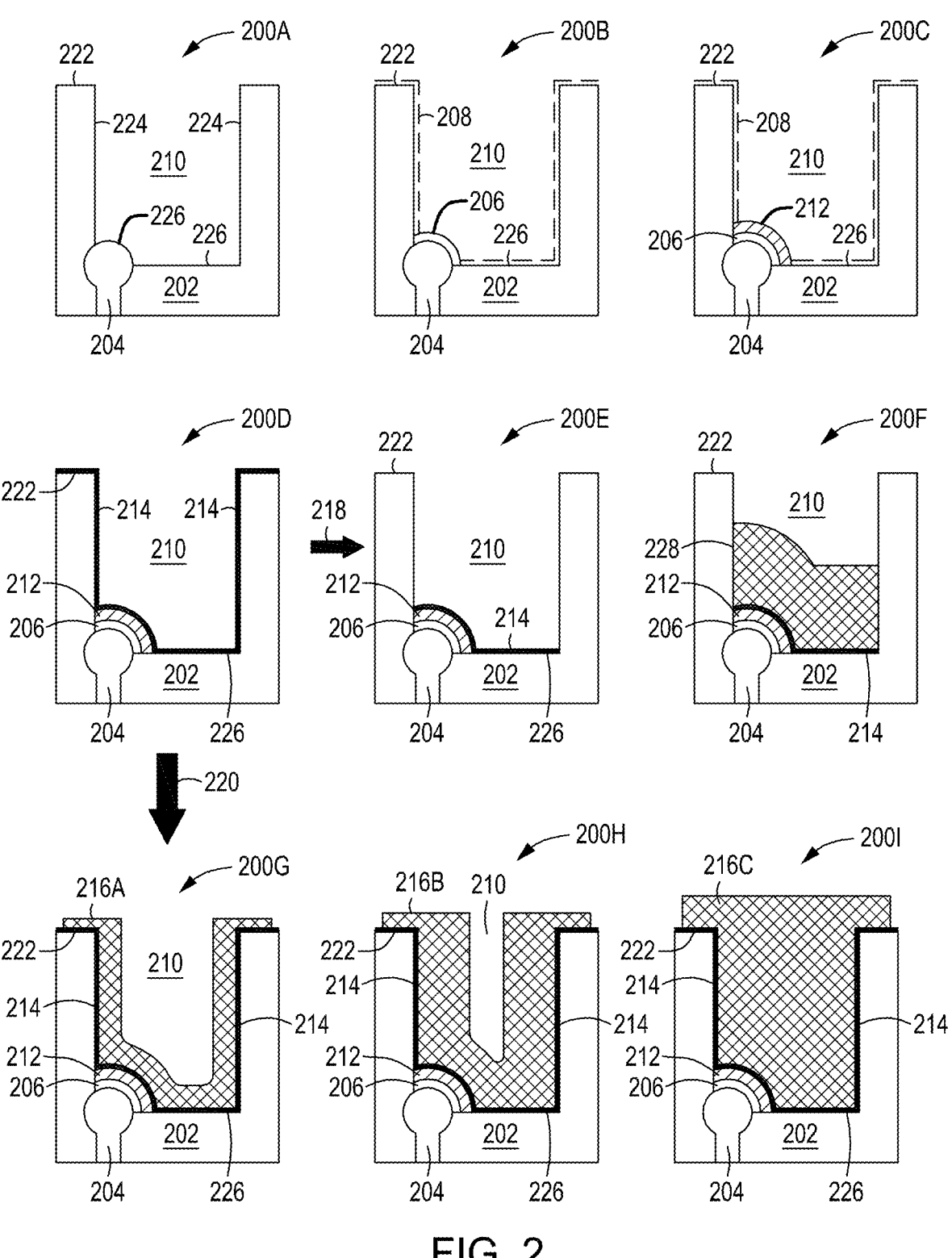
FIG. 2 depicts cross-sectional views of contact resistance reduction processes in accordance with some embodiments of the present principles.

In block 104, a selective TiSi deposition process is performed to produce a TiSi layer 206 on the silicon-based portion 204 as depicted in a view 200B of FIG. 2. The process is selective to the silicon-based portion 204 over the dielectric material of the substrate 202, but a thin TiSi layer 208 may also form on the surfaces of the field 222 of the substrate 202 and on sidewalls 224 in the cavity 210, including a bottom surface 226 of the cavity 210. In some embodiments, the selective TiSi deposition process is a CVD TiSi process with selectivity on silicon (Si) or silicon germanium (SiGe) over oxide/SiN of approximately greater than 30:1. With a deposition thickness of TiSi of approximately 3 nm to approximately 6 nm on the silicon-based portion 204, a selectivity loss on the field 222 or sidewalls 224 and the bottom surface 226 of the cavity 210 is generally less than approximately 1 angstrom to approximately 3 angstroms. Thus, the CVD TiSi process provides a good basis for in-situ selective FFW growth.

In block 106, a selective metal cap 212 is deposited on the TiSi layer 206 on the silicon-based portion 204 as depicted in a view 200C of FIG. 2. The selective metal cap 212 may be deposited using a selective deposition process that is a fluorine free metal deposition process of the metal material used for forming the selective metal cap 212. In some embodiments, the selective metal cap 212 may be formed of tungsten. In some embodiments, the selective metal cap 212 may be formed of molybdenum. For example, in some embodiments, an in-situ selective FFW material is deposited on the TiSi layer as a silicide capping layer. In so doing, a highly resistive TiSiN layer is eliminated from the process flow because the in-situ deposition process eliminates the TiSi layer from being exposed to oxygen prior to the deposition of the selective metal cap 212. In some embodiments, the selective FFW process can be from a halide based atomic layer deposition (ALD) process. In some embodiments, the selective FFW process can be from a metal chloride process such as from a CVD (WCl$_5$+H$_2$) process or from a CVD (WCl$_6$+H$_2$) process. In some embodiments, the selective FFW process can be from a process using metalorganic precursors.

In block 108, a thin metal seed layer 214 is deposited in the cavity 210 and on the field 222 as depicted in a view 200D of FIG. 2. In some embodiments, the selective metal cap 212 may be formed of tungsten. In some embodiments, the selective metal cap 212 may be formed of molybdenum. In some embodiments, for example, a thin PVD W layer provides W seeding on a bottom of the cavity 210 (e.g., SiO$_2$ or SiN surface where selective FFW cannot grow). The PVD process may be biased to produce an anisotropic deposition (more deposition on field and bottom of cavity than on sidewalls of cavity, etc.). The PVD plasma bombardment on selective ALD or CVD FFW can anneal the FFW film and improve the FFW film's oxidation and F barrier properties, which in turn reduces FFW thickness requirements. The PVD W no longer serves as TiSi protection layer (as found in traditional processes), but only to provide a seeding layer on a bottom oxide surface for selective CVD W. Thus, the thin metal seed layer 214 bottom thickness requirement is reduced from approximately 4 nm to approximately 5 nm down to approximately 2 nm to approximately 3 nm. A thin PVD W layer also simplifies the W pull back (etch) process (for bottom-up gapfill processes), especially for a selective dry pull back process.

After deposition of the thin metal seed layer 214, a process may be used to perform a bottom-up gapfill (blocks 110, 112, arrow 218 in FIG. 2) or to perform a conformal gapfill process (block 114, arrow 220 in FIG. 2). For a bottom-up gapfill process, in block 110, a selective etch process is performed as depicted in in a view 200E of FIG. 2. For example, a simple and low cost in-situ dry etch or wet etch process can remove approximately 3 nm to approximately 4 nm of the thin metal seed layer 214 (e.g., PVD W, etc.) on the field 222 and sidewalls 224 of the cavity 210, leaving the bottom surface 226 with a portion of the thin metal seed layer 214 (see view 200E of FIG. 2). The tungsten pull back does not have to be performed in-situ (in the same integrated tool as the above processes). In block 112, a metal gapfill material 228 is deposited in a bottom-up selective process (e.g., a tungsten hexafluoride (WF$_6$) based selective process (tungsten over dielectric material of the sidewalls 224 of the cavity 210, etc.)) as depicted in a view 200F of FIG. 2. After a wet/dry pull back (etch), FFW+PVD W seed layer is only left at the bottom of the structure and on the silicon-based portion, which provides a seed layer, for example, for a selective CVD W bottom-up gapfill. In some embodiments, a portion of the thin metal seed layer 214 on the selective metal cap 212 protects the selective metal cap 212 during etching processes.

In some embodiments, a conformal gapfill may be used instead of a bottom-up fill after the thin metal seed layer 214 is deposited (block 108) (see view 200D of FIG. 2). In block 114, a metal gapfill is deposited using a conformal deposition process as depicted in views 200G-200I. In some embodiments, for example, the cavity 210 may be filled by conformal CVD using tungsten or molybdenum and the like. In some embodiments, a conformal molybdenum fill can be performed by using MoO$_2$Cl$_2$ or MoOCl$_4$+H$_2$ processes or a mixture of MoCl$_5$ with the aforementioned two precursors. View 200G depicts the first layers 216A of the conformal fill process. View 200H depicts additional layers 216B of the conformal fill process. View 200I depicts a filled cavity 216C.

As stated previously, in addition to tungsten as a TiSi capping layer, molybdenum (Mo) can be used as a capping material as well by selective Mo process. The thin metal seed layer 214 can also be a thin PVD Mo seed layer. Similarly, the structure fill can be done by selective Mo fill or conformal Mo fill. In some embodiments, Mo and W materials can be interchanged or mixture of Mo and W used.

Figure 3:
FIG. 3 depicts an integrated tool in accordance with some embodiments of the present principles.

The methods described herein may be performed in individual process chambers that may be provided as part of a cluster tool, for example, the integrated tool 300 (i.e., cluster tool) described below with respect to FIG. 3. The advantage of using an integrated tool 300 is that there is no vacuum break between chambers and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate such as oxidation and the like. The integrated tool 300 includes a vacuum-tight processing platform 301, a factory interface 304, and a system controller 302. The processing platform 301 comprises multiple processing chambers, such as 314A, 313B, 314C, 314D, 314E, and 314F operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314F and a cooldown station 340 or a pre-clean station 342. The vacuum robot 342B is capable of transferring substrates

321 between the cooldown station 340 or pre-clean station 342 and the processing chambers 314B, 314C, 314D, and 314E.

In some embodiments, the processing chambers 314A, 314B, 314C, 314D, 314E, and 314F are coupled to the transfer chambers 303A, 303B. The processing chambers 314A, 314B, 314C, 314D, 314E, and 314F may comprise, for example, preclean chambers, ALD process chambers, PVD process chambers, remote plasma chambers, CVD chambers, or the like. The chambers may include any chambers suitable to perform all or portions of the methods described herein, as discussed above, such as PVD W or PVD Mo chambers, CVD chambers, ALD chambers and the like. In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down, and the like.

The system controller 302 controls the operation of the tool 300 using a direct control of the process chambers 314A, 314B, 314C, 314D, 314E, and 314F or alternatively, by controlling the computers (or controllers) associated with the process chambers 314A, 314B, 314C, 314D, 314E, and 314F and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general-purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for reducing contact resistance, comprising:
performing a selective titanium silicide (TiSi) deposition process on a middle-of-the-line (MOL) contact structure including a cavity in a substrate of dielectric material with a silicon-based connection portion at a bottom of the cavity, wherein the selective TiSi deposition process is selective to silicon-based material over dielectric material and a TiSi layer of approximately 3 nm to approximately 6 nm is formed on the silicon-based connection portion;
performing a selective deposition process of a metal material on the MOL contact structure, wherein the selective deposition process is selective to TiSi material over dielectric material and forms a silicide capping layer on the silicon-based connection portion; and
performing a seed layer deposition process of the metal material on the contact structure, wherein the metal material deposited on the contact structure is approximately 2 nm to approximately 3 nm in thickness.

2. The method of claim 1, wherein the dielectric material is silicon dioxide or silicon nitride, wherein the silicon-based connection portion is silicon or silicon germanium, and wherein the silicon-based material is silicon or silicon germanium.

3. The method of claim 1, wherein the selective TiSi deposition process is a chemical vapor deposition (CVD) process with a selectivity of silicon-based material to dielectric material of at least 30:1.

4. The method of claim 1, wherein the selective deposition process is a fluorine free metal deposition process of the metal material.

5. The method of claim 4, wherein the fluorine free metal deposition process is a halide based atomic layer deposition (ALD) process or chemical vapor deposition (CVD) process using a metal chloride gas with hydrogen gas or a process using metalorganic precursors.

6. The method of claim 4, wherein the seed layer deposition process is a plasma vapor deposition (PVD) process that anneals the metal material deposited by the fluorine free metal deposition process.

7. The method of claim 1, wherein the metal material is tungsten or molybdenum.

8. The method of claim 1, further comprising:
performing a preclean process on the MOL contact structure prior to performing the selective TiSi deposition process.

9. The method of claim 1, further comprising:
performing a selective etch process to remove portions of the metal material deposited by the seed layer deposition process on sidewalls of the cavity of the MOL contact structure while maintaining the metal material on the bottom of the contact structure and on the silicon-based connection portion; and
depositing a metal gapfill material in a bottom-up selective deposition process to fill the MOL contact structure.

10. The method of claim 9, wherein the selective etch process is a dry etch process or a wet etch process.

11. The method of claim 9, wherein the bottom-up selective deposition process is a selective chemical vapor deposition (CVD) process.

12. The method of claim 1, further comprising:
depositing a metal gapfill material in the cavity of the MOL contact structure using a conformal deposition process.

13. The method of claim 1, wherein the method uses a mix of tungsten material and molybdenum material in the method.

14. A method for reducing contact resistance, comprising:
performing a selective titanium silicide (TiSi) deposition process on a middle-of-the-line (MOL) contact structure including a cavity in a substrate of dielectric material with a silicon-based connection portion at a bottom of the cavity, wherein the selective TiSi deposition process is selective to silicon-based material over dielectric material and a TiSi layer of approximately 3 nm to approximately 6 nm is formed on the silicon-based connection portion;

performing a selective deposition process of fluorine free tungsten on the MOL contact structure in-situ, wherein the selective deposition process is selective to TiSi material over dielectric material and forms a silicide capping layer on the silicon-based connection portion;

performing a seed layer deposition process of tungsten on the contact structure, wherein tungsten deposited on the contact structure is approximately 2 nm to approximately 3 nm in thickness;

performing a selective etch process to remove portions of tungsten deposited by the seed layer deposition process on sidewalls of the cavity of the MOL contact structure while maintaining tungsten on the bottom of the contact structure and on the silicon-based connection portion; and depositing a tungsten gapfill material in a bottom-up selective deposition process to fill the MOL contact structure.

15. The method of claim 14, wherein the dielectric material is silicon oxide or silicon nitride, wherein the silicon-based connection portion is silicon or silicon germanium, and wherein the silicon-based material is silicon or silicon germanium.

16. The method of claim 14, wherein the selective TiSi deposition process is a chemical vapor deposition (CVD) process with a selectivity of silicon-based material to dielectric material of at least 30:1.

17. The method of claim 14, wherein the selective deposition process is a halide based atomic layer deposition (ALD) process or chemical vapor deposition (CVD) process using a tungsten chloride gas with hydrogen gas or a process using metalorganic precursors.

18. The method of claim 14, wherein the seed layer deposition process is a plasma vapor deposition (PVD) process that anneals tungsten deposited by the selective deposition process.

19. The method of claim 14, wherein the bottom-up selective deposition process is a selective chemical vapor deposition (CVD) process.

20. A non-transitory, computer readable medium having instructions stored thereon that, when executed, cause a method for decreasing contact resistance to be performed, the method comprising:

performing a selective titanium silicide (TiSi) deposition process on a middle-of-the-line (MOL) contact structure including a cavity in a substrate of dielectric material with a silicon or silicon germanium connection portion at a bottom of the cavity, wherein the selective TiSi deposition process is selective to silicon or silicon germanium material over dielectric material and a TiSi layer of approximately 3 nm to approximately 6 nm is formed on the silicon or silicon germanium connection portion;

performing a selective deposition process of fluorine free tungsten on the MOL contact structure in-situ, wherein the selective deposition process is selective to TiSi material over dielectric material and forms a silicide capping layer on the silicon or silicon germanium connection portion;

performing a seed layer deposition process of tungsten on the contact structure, wherein tungsten deposited on the contact structure is approximately 2 nm to approximately 3 nm in thickness;

performing a selective etch process to remove portions of tungsten deposited by the seed layer deposition process on sidewalls of the cavity of the MOL contact structure while maintaining tungsten on the bottom of the contact structure and on the silicon or silicon germanium connection portion; and depositing a tungsten gapfill material in a bottom-up selective deposition process to fill the MOL contact structure.

\* \* \* \* \*